US010460875B2

(12) United States Patent
Park et al.

(10) Patent No.: US 10,460,875 B2
(45) Date of Patent: Oct. 29, 2019

(54) MULTILAYER ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Heung Kil Park, Suwon-si (KR); Jae Yeol Choi, Suwon-si (KR); Young Ghyu Ahn, Suwon-si (KR); Soo Hwan Son, Suwon-si (KR); Se Hun Park, Suwon-si (KR); Gu Won Ji, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/360,549

(22) Filed: Mar. 21, 2019

(65) Prior Publication Data

US 2019/0221369 A1    Jul. 18, 2019

Related U.S. Application Data

(62) Division of application No. 15/810,738, filed on Nov. 13, 2017.

(30) Foreign Application Priority Data

May 4, 2017  (KR) .................... 10-2017-0056900
Jul. 7, 2017  (KR) .................... 10-2017-0086206

(51) Int. Cl.
*H01G 4/232* (2006.01)
*H05K 3/34* (2006.01)
(Continued)

(52) U.S. Cl.
CPC ............. *H01G 4/232* (2013.01); *H01G 4/012* (2013.01); *H01G 4/30* (2013.01); *H05K 1/111* (2013.01);
(Continued)

(58) Field of Classification Search
CPC .......... H01G 4/232; H01G 4/30; H01G 4/012; H01G 4/248; H05K 1/181; H05K 2201/10015; H05K 3/3442
(Continued)

(56) References Cited

U.S. PATENT DOCUMENTS 6,381,117 B1    4/2002  Nakagawa et al.
2008/0128860 A1  6/2008  Sawada
(Continued)

FOREIGN PATENT DOCUMENTS

CN    104347267 A    2/2015
CN    104810152 A    7/2015
(Continued)

OTHER PUBLICATIONS

Office Action issued in corresponding Chinese Application No. 201810017130.4 dated Sep. 4, 2019, with English translation.

*Primary Examiner* — Sherman Ng
(74) *Attorney, Agent, or Firm* — Morgan, Lewis & Bockius LLP

(57) ABSTRACT

A multilayer electronic component includes a capacitor body including a plurality of dielectric layers and a plurality of first and second internal electrodes alternately disposed with respective dielectric layers interposed therebetween. One end of each of the first and second internal electrodes extends, respectively, to a third or fourth surface of the capacitor body. First and second external electrodes respectively include first and second connected portions disposed on the third and fourth surfaces, and first and second band (Continued)

portions respectively extended from the first and second connected portions to portions of a first surface of the capacitor body. A first connection terminal is disposed on the first band portion to provide a first solder accommodating portion, and a second connection terminal is disposed on the second band portion to provide a second solder accommodating portion.

9 Claims, 9 Drawing Sheets

(51) Int. Cl.
| | |
|---|---|
| *H01G 4/30* | (2006.01) |
| *H01G 4/012* | (2006.01) |
| *H05K 1/11* | (2006.01) |
| *H01G 4/248* | (2006.01) |
| *H01G 4/12* | (2006.01) |
| *H05K 1/18* | (2006.01) |

(52) U.S. Cl.
CPC ......... *H05K 3/3442* (2013.01); *H01G 4/1227* (2013.01); *H01G 4/248* (2013.01); *H05K 1/181* (2013.01); *H05K 2201/10015* (2013.01); *H05K 2201/1078* (2013.01); *H05K 2201/10636* (2013.01)

(58) Field of Classification Search
USPC .......................................... 174/260; 361/306.3
See application file for complete search history.

(56) References Cited

U.S. PATENT DOCUMENTS

| | | | |
|---|---|---|---|
| 2010/0123995 | A1 | 5/2010 | Otsuka |
| 2010/0188798 | A1* | 7/2010 | Togashi ................... H01G 2/06 361/306.3 |
| 2014/0016242 | A1* | 1/2014 | Hattori ..................... H01G 2/06 361/303 |
| 2015/0026972 | A1 | 1/2015 | Ogawa et al. |
| 2016/0093441 | A1* | 3/2016 | Ahn ........................ H01G 4/232 174/260 |
| 2016/0118190 | A1* | 4/2016 | Park ......................... H01G 4/30 174/260 |
| 2016/0126015 | A1* | 5/2016 | Park ......................... H01G 4/30 174/260 |

FOREIGN PATENT DOCUMENTS

| | | |
|---|---|---|
| CN | 104979096 A | 10/2015 |
| JP | H0684687 A | 3/1994 |

\* cited by examiner

MULTILAYER ELECTRONIC COMPONENT AND BOARD HAVING THE SAME

CROSS-REFERENCE TO RELATED APPLICATION(S)

This application is the divisional application of U.S. patent application Ser. No. 15/810,738 filed on Nov. 13, 2017, now allowed, which claims benefit of priority to Korean Patent Applications No. 10-2017-0056900 filed on May 4, 2017 and No. 10-2017-0086206 filed on Jul. 7, 2017 in the Korean Intellectual Property Office, the disclosures of which are incorporated herein by reference in their entireties.

BACKGROUND

1. Field

The present disclosure relates to a multilayer electronic component and a board having the same.

2. Description of Related Art

A multilayer electronic component, such as a multilayer capacitor, is formed of a dielectric material, and such a dielectric material may have a piezoelectric property causing the material to be deformed in synchronization with a voltage applied thereto.

When a period of the applied voltage is in an audio frequency band, a displacement of the dielectric material may cause vibration to be transferred to a circuit board through solders, and vibration of the circuit board is thus heard as sound. Such a sound is known as acoustic noise.

In a case in which a device is operated in a silent environment, a user may experience the acoustic noise as an abnormal sound and believe that a fault has occurred in the device. In addition, in a device having an audio circuit, the acoustic noise overlaps an audio output and may thus cause noise in the audio output, such that quality of the device may be deteriorated.

In addition, in a case in which piezoelectric vibrations of the multilayer capacitor are generated in a high frequency region of 20 kHz or more, separately from the acoustic noise recognized by a listener, the high frequency vibrations may result in malfunctions of various sensors used in information technology (IT) and industry/electrical component fields.

Meanwhile, external electrodes of the capacitor and the circuit board are connected to each other by solders. In this case, the solders are formed in an inclined state at a predetermined height on surfaces of the external electrodes on both side surfaces, or both end surfaces, of a capacitor body.

In the case that a volume and a height of the solders are increased, the vibrations of the multilayer capacitor are more easily transferred to the circuit board, such that a magnitude of the generated acoustic noise may be increased.

SUMMARY

An aspect of the present disclosure may provide a multilayer electronic component having reduced acoustic noise and reduced high frequency vibration in a high frequency region of 20 kHz or more. A board having the multilayer electronic component is also provided.

According to an aspect of the present disclosure, a multilayer electronic component may include a capacitor body including a plurality of dielectric layers and a plurality of first and second internal electrodes alternately disposed with dielectric layers interposed therebetween. The capacitor body has first and second surfaces opposing each other, third and fourth surfaces connected to the first and second surfaces and opposing each other, and fifth and sixth surfaces connected to the first, second, third, and fourth surfaces, and opposing each other. One end of each of the first and second internal electrodes is exposed through the third and fourth surfaces, respectively. The multilayer electronic component further includes first and second external electrodes including, respectively, first and second connected portions respectively disposed on the third and fourth surfaces of the capacitor body and first and second band portions respectively extended from the first and second connected portions to portions of the first surface of the capacitor body. A first connection terminal is disposed on the first band portion so that a first solder accommodating portion, open toward the third surface of the capacitor body, is provided along the first surface of the capacitor body. A second connection terminal is disposed on the second band portion so that a second solder accommodating portion, open toward the fourth surface of the capacitor body, is provided along the first surface of the capacitor body.

The first and second connection terminals may be bump terminals.

The multilayer electronic component may further include first and second conductive resin layers formed on at least portions of surfaces of the first and second connection terminals.

The first and second connection terminals may each have a thickness of 50 μm or more.

The first and second connection terminals may be disposed to be spaced apart from the first and second connected portions, respectively. The first solder accommodating portion may be a first space portion, open in directions extending towards the third surface, the fifth surface, and the sixth surface of the capacitor body on a lower surface of the first band portion. The second solder accommodating portion may be a second space portion, open in directions extending towards the fourth surface, the fifth surface, and the sixth surface of the capacitor body on a lower surface of the second band portion.

The first and second connection terminals may cover portions of the first and second band portions.

The first and second external electrodes may further respectively include third and fourth band portions extended from the first and second connected portions to portions of the second surface of the capacitor body, and third and fourth connection terminals may be disposed on the third and fourth band portions, respectively, to be disposed opposite to the first and second connection terminals, respectively.

The multilayer electronic component may satisfy $BW/4 \leq G \leq 3BW/4$ in which BW is a width of the first or second band portion of the first or second external electrode, and G is a length of the first or second solder accommodating portion.

The multilayer electronic component may satisfy $W/2 \leq BG \leq W$ in which BG is a width of the first or second connection terminal measured in a first direction parallel to the third and fourth surfaces of the capacitor body, and W is a width of the capacitor body measured in the first direction.

The first connection terminal may have a first cut portion so that the first solder accommodating portion is provided, and the second connection terminal may have a second cut portion so that the second solder accommodating portion is provided.

The first and second cut portions may have curved surfaces.

The first and second cut portions may include a plurality of bent surfaces.

Two first connection terminals may be disposed on the first band portion to be spaced apart from each other in a direction in which the fifth surface and the sixth surface of the capacitor body are connected to each other, and two second connection terminals may be disposed on the second band portion to be spaced apart from each other in the direction in which the fifth surface and the sixth surface of the capacitor body are connected to each other.

The first and second external electrodes may further include third and fourth band portions extended from the first and second connected portions to portions of the second surface of the capacitor body, respectively. Two third connection terminals may be disposed on the third band portion to be spaced apart from each other in the direction in which the fifth surface and the sixth surface of the capacitor body are connected to each other, and two fourth connection terminals may be disposed on the fourth band portion to be spaced apart from each other in the direction in which the fifth surface and the sixth surface of the capacitor body are connected to each other.

Lower surfaces of the first and second connection terminals may be flat.

The first and second connection terminals may be convex in a mounting direction.

According to another aspect of the present disclosure, a multilayer electronic component may include a capacitor body including a plurality of dielectric layers and a plurality of first and second internal electrodes alternately disposed with dielectric layers interposed therebetween. The capacitor body may have first and second surfaces opposing each other, third and fourth surfaces connected to the first and second surfaces and opposing each other, and fifth and sixth surfaces connected to the first, second, third, and fourth surfaces, and opposing each other. One end of each of the first and second internal electrodes may be exposed through the third and fourth surfaces, respectively. First and second external electrodes may include, respectively, first and second connected portions respectively disposed on the third and fourth surfaces of the capacitor body and first and second band portions respectively extended from the first and second connected portions to portions of the first surface of the capacitor body. A first connection terminal may be disposed on the first band portion to be spaced apart from the first connected portion so that a first space portion, open in directions corresponding to the third surface, the fifth surface, and the sixth surface of the capacitor body is provided on a lower surface of the first band portion. A second connection terminal may be disposed on the second band portion to be spaced apart from the second connected portion so that a second space portion, open in directions corresponding to the fourth surface, the fifth surface, and the sixth surface of the capacitor body is provided on a lower surface of the second band portion. The first and second space portions may become first and second solder accommodating portions, respectively.

According to another aspect of the present disclosure, a multilayer electronic component may include a capacitor body including a plurality of dielectric layers and a plurality of first and second internal electrodes alternately disposed with dielectric layers interposed therebetween. The capacitor body may have first and second surfaces opposing each other, third and fourth surfaces connected to the first and second surfaces and opposing each other, and fifth and sixth surfaces connected to the first, second, third, and fourth surfaces, and opposing each other. One end of each of the first and second internal electrodes may be exposed through the third and fourth surfaces, respectively. First and second external electrodes may include, respectively, first and second connected portions respectively disposed on the third and fourth surfaces of the capacitor body and first and second band portions respectively extended from the first and second connected portions to portions of the first surface of the capacitor body. A first connection terminal may be disposed on the first band portion and have a first cut portion, open toward the third surface of the capacitor body. A second connection terminal may be disposed on the second band portion and have a second cut portion, open toward the fourth surface of the capacitor body. The first and second cut portions may become first and second solder accommodating portions, respectively.

According to another aspect of the present disclosure, a board having a multilayer electronic component may include a circuit board having first and second electrode pads disposed on one surface thereof, and a multilayer electronic component as described above mounted on the circuit board so that the first and second connection terminals are connected to the first and second electrode pads, respectively.

According to a further aspect of the disclosure, a multilayer electronic component may include a capacitor body including pluralities of first and second internal electrodes alternately stacked with dielectric layers disposed therebetween. First and second external electrodes may be disposed on respective opposing end surfaces of the capacitor body and may respectively be connected to the pluralities of first and second internal electrodes. The first and second external electrodes may respectively include first and second connected portions disposed on a connecting surface of the capacitor body connecting the opposing end surfaces of the capacitor body. A first connection terminal may be disposed on the first connected portion on the connecting surface of the capacitor body, the first connection terminal comprising first and second connection terminal portions disposed separately from each other on the first connected portion. A second connection terminal may be disposed on the second connected portion on the connecting surface of the capacitor body, the second connection terminal comprising third and fourth connection terminal portions disposed separately from each other on the second connected portion.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings.

Figure 1:
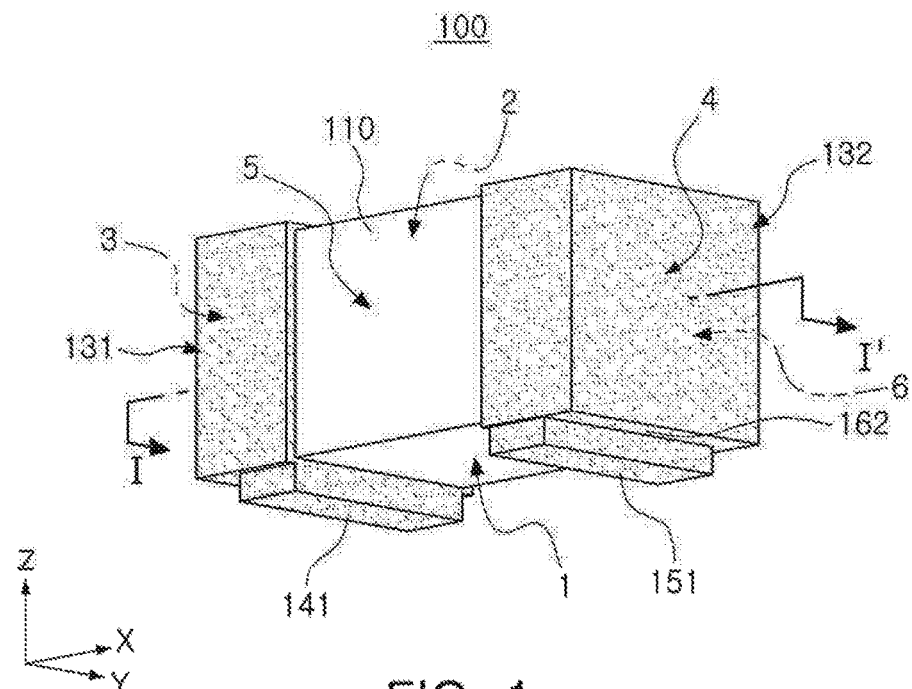
FIG. 1 is a perspective view illustrating a multilayer electronic component according to a first exemplary embodiment.
Figure 2:
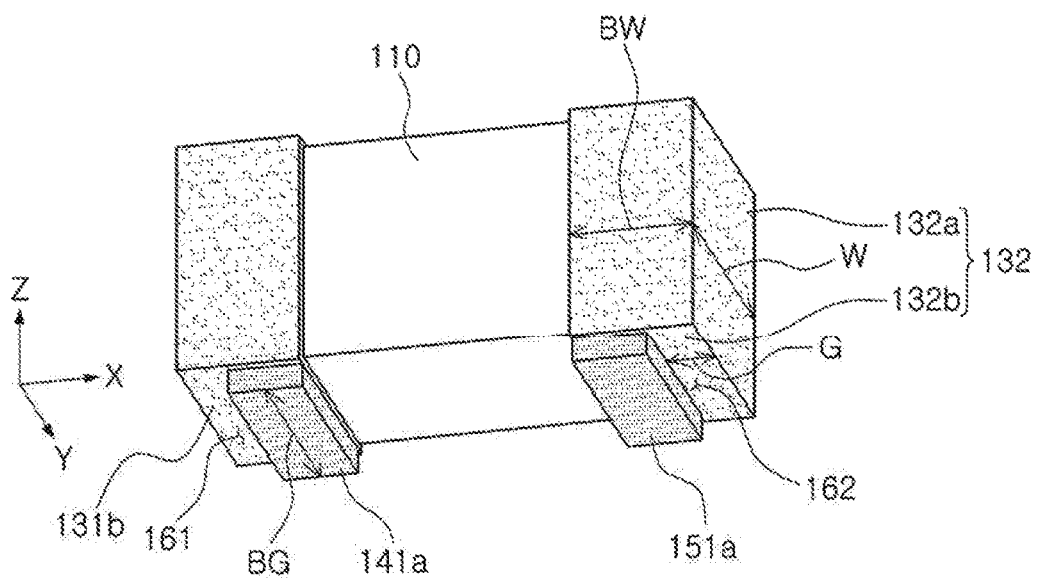
FIG. 2 is a perspective view illustrating plating layers formed on first and second connection terminals of the multilayer electronic component shown in FIG. 1.
Figure 3A:
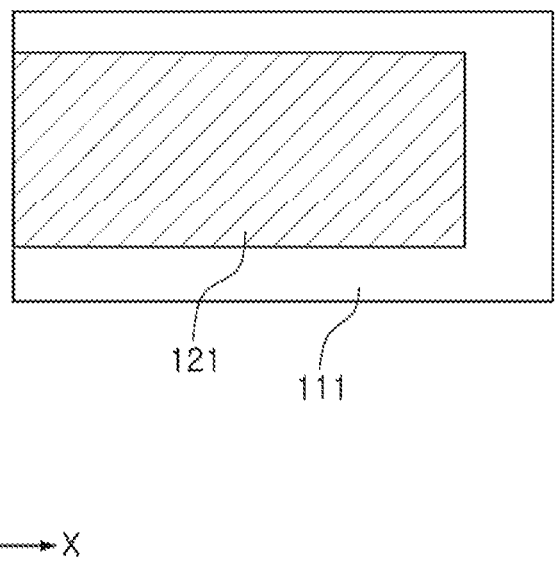
FIGS. 3A and 3B are plan views illustrating, respectively, first and second internal electrodes of the multilayer electronic component according to a first exemplary embodiment.
Figure 3B:
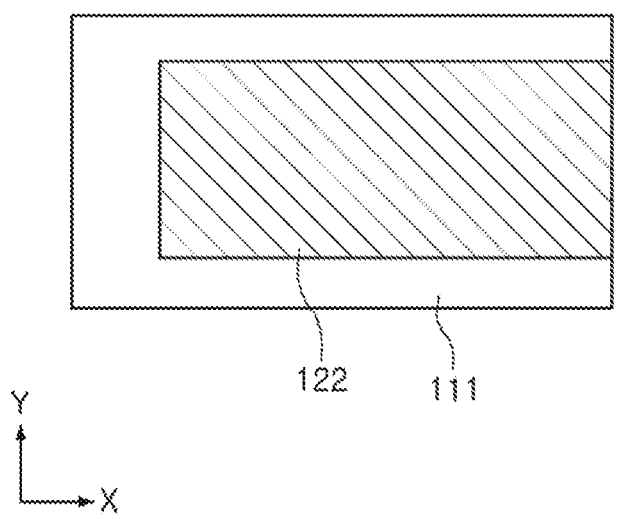
Figure 4:
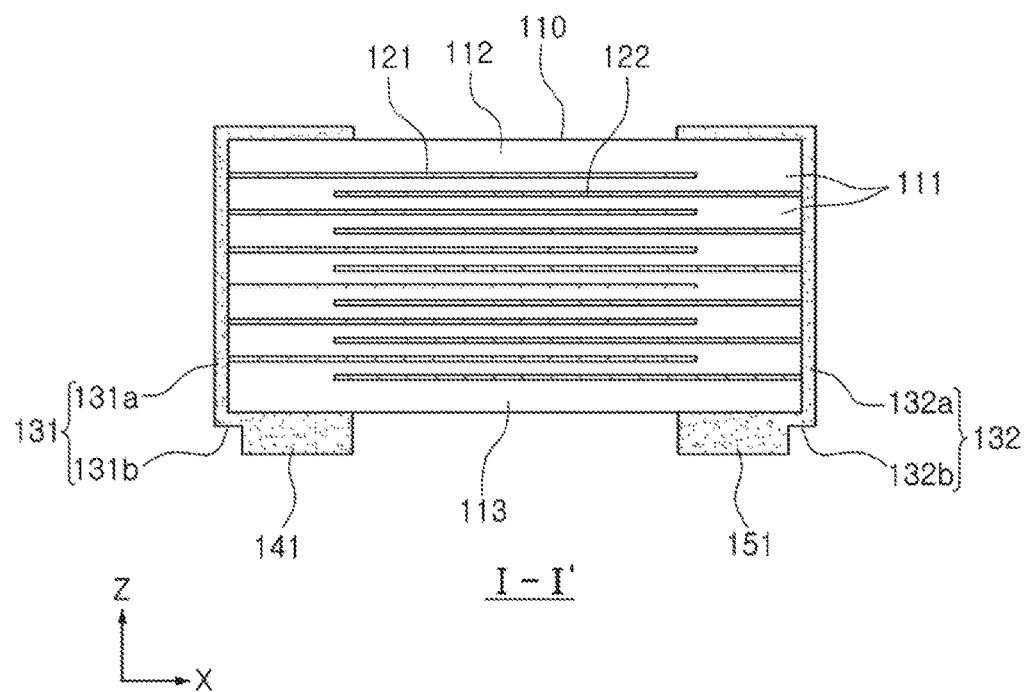
FIG. 4 is a cross-sectional view of the multilayer electronic component taken along line I-I' of FIG. 1.

FIG. 1 is a perspective view illustrating a multilayer electronic component according to a first exemplary embodiment, FIG. 2 is a perspective view illustrating plating layers formed on first and second connection terminals of the multilayer electronic component shown in FIG. 1, FIGS. 3A and 3B are plan views illustrating, respectively, first and second internal electrodes of the multilayer electronic component according to the first exemplary embodiment, and FIG. 4 is a cross-sectional view taken along line I-I' of FIG. 1.

Referring to FIGS. 1, 2, 3A, 3B, and 4, a multilayer electronic component 100 according to the first exemplary embodiment may include a capacitor body 110, first and second external electrodes 131 and 132, and first and second connection terminals 141 and 151 disposed on the first and second external electrodes 131 and 132, respectively, so that first and second solder accommodating portions are provided on a mounting surface of the capacitor body.

Hereinafter, directions of the capacitor body 110 will be defined in order to clearly describe exemplary embodiments in the present disclosure. X, Y, and Z in the drawings refer to a length direction, a width direction, and a thickness direction of the capacitor body 110, respectively. In addition, in the present exemplary embodiment, the thickness direction refers to a stacking direction in which dielectric layers are stacked within the capacitor body 110.

The capacitor body 110 may be formed by stacking and then sintering a plurality of dielectric layers 111 in the Z direction, and may include the plurality of dielectric layers 111 and a plurality of first and second internal electrodes 121 and 122 alternately disposed in the Z direction with respective dielectric layers 111 interposed therebetween.

In addition, covers 112 and 113 having a predetermined thickness may be formed, respectively, at both sides of the capacitor body 110 in the Z direction, if necessary.

Here, the respective adjacent dielectric layers 111 of the capacitor body 110 may be integrated with each other so that boundaries therebetween may not be readily apparent.

The capacitor body 110 may have a substantially hexahedral shape. However, a shape of the capacitor body 110 is not limited thereto.

In the present exemplary embodiment, for convenience of explanation, first and second surfaces 1 and 2 of the capacitor body 110 refer to surfaces of the capacitor body 110 opposing each other in the Z direction, third and fourth surfaces 3 and 4 of the capacitor body 110 refer to both surfaces of the capacitor body 110 connected to the first and second surfaces 1 and 2 and opposing each other in the X direction, and fifth and sixth surfaces 5 and 6 of the capacitor body 110 refer to both surfaces of the capacitor body 110 connected to the first and second surfaces 1 and 2, connected to the third and fourth surfaces 3 and 4, and opposing each other in the Y direction. In the present exemplary embodiment, the first surface 1 (e.g., a lower surface in the orientation shown in FIG. 1) may be a mounting surface.

In addition, the dielectric layer 111 may include a ceramic material having a high dielectric constant, for example, a barium titanate ($BaTiO_3$) based ceramic powder, or the like. However, a material of the dielectric layer 111 is not limited thereto.

An example of the barium titanate ($BaTiO_3$) based ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, in which Ca, Zr, or the like, is partially dissolved in $BaTiO_3$. However, an example of the barium titanate ($BaTiO_3$) based ceramic powder is not limited thereto.

In addition, the dielectric layer 111 may further include a ceramic additive, an organic solvent, a plasticizer, a binder, a dispersant, and the like, in addition to the ceramic powder. As the ceramic additive, for example, a transition metal oxide or a transition metal carbide, a rare earth element, magnesium (Mg), aluminum (Al), or the like, may be used.

The first and second internal electrodes 121 and 122, which are electrodes having different polarities, may be alternately disposed to face each other in the Z direction with respective dielectric layers 111 interposed therebetween, and one end of each of the first and second internal electrodes 121 and 122 may be exposed through the third and fourth surfaces 3 and 4 of the capacitor body 110, respectively.

Here, the first and second internal electrodes 121 and 122 may be electrically insulated from each other by the dielectric layer 111 disposed therebetween.

The end portions of the first and second internal electrodes 121 and 122 alternately exposed through the third and fourth surfaces 3 and 4 of the capacitor body 110, respectively, may be respectively electrically connected to first and second external electrodes 131 and 132 disposed on third and fourth surfaces 3 and 4 of the capacitor body 110 to be described below.

Here, the first and second internal electrodes 121 and 122 may be formed of a conductive metal, for example, a material such as nickel (Ni), a nickel (Ni) alloy, or the like. However, materials of the first and second internal electrodes 121 and 122 are not limited thereto.

According to the configuration as described above, when predetermined voltages are applied to the first and second external electrodes 131 and 132, electric charges may be accumulated between the first and second internal electrodes 121 and 122 facing each other.

Here, a capacitance of the multilayer ceramic component 100 may be in proportion to an area over which the first and second internal electrodes 121 and 122 overlap each other in the Z direction.

Voltages having different polarities may be provided to the first and second external electrodes 131 and 132, respectively, and the first and second external electrodes 131 and 132 may be electrically connected to the exposed portions of the first and second internal electrodes 121 and 122, respectively.

Plating layers may be formed on surfaces of the first and second external electrodes 131 and 132, if necessary.

For example, the first and second external electrodes 131 and 132 may include first and second conductive layers, first and second nickel (Ni) plating layers formed on the first and second conductive layers, and first and second tin (Sn) plating layers formed on the first and second nickel plating layers, respectively.

The first external electrode 131 may include a first connected portion 131a and a first band portion 131b.

The first connected portion 131a may be formed on the third surface 3 of the capacitor body 110 and be connected to (e.g., in contact with) each of the first internal electrodes 121, and the first band portion 131b may be extended from the first connected portion 131a to a portion of the first surface 1 of the capacitor body 110, which is the mounting surface of the capacitor body 110, and be connected to the first connection terminal 141.

Here, the first band portion 131b may be further extended to a portion of the second surface 2 of the capacitor body 110 and portions of the fifth and sixth surfaces 5 and 6 of the capacitor body 110, if desired, in order to improve adhesion strength, or the like.

The second external electrode 132 may include a second connected portion 132a and a second band portion 132b.

The second connected portion 132a may be formed on the fourth surface 4 of the capacitor body 110 and be connected to (e.g., in contact with) each of the second internal electrodes 122, and the second band portion 132b may be extended from the second connected portion 132a to a portion of the first surface 1 of the capacitor body 110, which is the mounting surface of the capacitor body 110, and be connected to the second connection terminal 151.

Here, the second band portion 132b may be further extended to a portion of the second surface 2 of the capacitor body 110 and portions of the fifth and sixth surfaces 5 and 6 of the capacitor body 110, if desired, in order to improve adhesion strength, or the like.

The first connection terminal 141 may be formed of a conductor, and may have a first connection surface facing the first band portion 131b of the first external electrode 131 on the first surface 1 of the capacitor body 110, a second connection surface opposing the first connection surface in the Z direction, and first circumferential surfaces connecting the first and second connection surfaces to each other.

In addition, the first connection terminal 141 may cover only a portion of the first band portion 131b. Therefore, a portion that is not covered by the first connection terminal 141 on a lower surface of the first band portion 131b on the first surface 1 of the capacitor body 110, which is the mounting surface of the capacitor body 110, may become a first solder accommodating portion as a solder pocket.

In addition, the first connection terminal 141 may be disposed to be biased toward the center of the capacitor body 110 in the X direction. For example, the first connection terminal 141 may be spaced apart from an outer edge of the capacitor body 110 in the X direction.

Here, a length of the first connection terminal 141 in the X direction may be smaller than a length of the first band portion 131b in the X direction.

Therefore, the first solder accommodating portion may be open toward the third surface 3 of the capacitor body 110, and a space G as large as possible as the solder pocket may thus be secured.

The second connection terminal 151 may be formed of a conductor, and may have a third connection surface facing the second band portion 132b of the second external electrode 132 on the first surface 1 of the capacitor body 110, a fourth connection surface opposing the third connection surface in the Z direction, and second circumferential surfaces connecting the third and fourth connection surfaces to each other.

In addition, the second connection terminal 151 may cover only a portion of the second band portion 132b. Therefore, a portion that is not covered by the second connection terminal 151 on a lower surface of the second band portion 132b on the first surface 1 of the capacitor body 110, which is the mounting surface of the capacitor body 110, may become a second solder accommodating portion as a solder pocket.

In addition, the second connection terminal 151 may be disposed to be biased toward the center of the capacitor body 110 in the X direction. For example, the second connection terminal 151 may be spaced apart from an outer edge of the capacitor body 110 in the X direction.

Here, a length of the second connection terminal 151 in the X direction may be smaller than a length BW of the second band portion 132b in the X direction.

Therefore, the second solder accommodating portion may be open toward the fourth surface 4 of the capacitor body 110, and a space as large as possible as the solder pocket may thus be secured.

In the present exemplary embodiment, the first connection terminal 141 may be disposed on the first band portion 131b to be spaced apart from the first connected portion 131a, and the second connection terminal 151 may be disposed on the second band portion 132b to be spaced apart from the second connected portion 132a.

Therefore, a first space portion 161 open toward directions corresponding to the third surface 3, the fifth surface 5, and the sixth surface 6 of the capacitor body 110 may be provided on the lower surface of the first band portion 131b, and may become the first solder accommodating portion.

Similarly, a second space portion 162 open toward directions corresponding to the fourth surface 4, the fifth surface 5, and the sixth surface 6 of the capacitor body 110 may be provided on the lower surface of the second band portion 132b, and may become the second solder accommodating portion. In the following description for exemplary embodiments, the space portions and the solder accommodating portions will be denoted by the same reference numerals.

Figure 5:
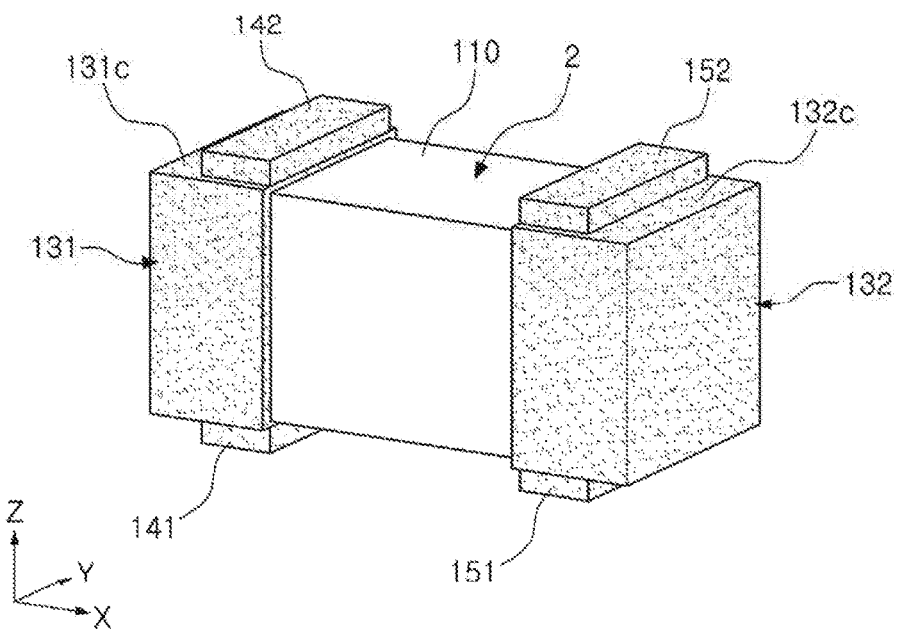
FIG. 5 is a perspective view illustrating that third and fourth connection terminals can be added to the multilayer electronic component shown in FIG. 1.

FIG. 5 is a perspective view illustrating that additional third and fourth connection terminals can be added to the structure shown in FIG. 1.

Referring to FIG. 5, a multilayer electronic component according to the present exemplary embodiment may further include third and fourth connection terminals 142 and 152. Therefore, vertical directivity of the multilayer electronic component may be removed.

To this end, the first and second external electrodes 131 and 132 may further include third and fourth band portions 131c and 132c extended from the first and second connected portions 131a and 132a to portions of the second surface 2 of the capacitor body 110, respectively. The third connection terminal 142 may be disposed on the third band portion 131c to be disposed opposite to the first connection terminal 141 in the Z direction, and the fourth connection terminal 152 may be disposed on the fourth band portion 132c to be disposed opposite to the second connection terminal 151 in the Z direction.

Here, the third and fourth connection terminals 142 and 152 may be formed in shapes similar to those of the first and second connection terminals 141 and 151 at positions corresponding to those of the first and second connection terminals 141 and 151 in the Z direction, respectively.

The first and second connection terminals 141 and 151 may be bump terminals linearly formed and extending in the Y direction on the first surface 1 of the capacitor body 110.

In addition, the first and second connection terminals 141 and 151 may be formed of the same material as that of the first and second external electrodes 131 and 132, and may be formed integrally with the first and second external electrodes 131 and 132, respectively.

In addition, the first and second connection terminals 141 and 151 may allow the capacitor body 110 to be spaced apart from a circuit board by a predetermined distance to thus suppress piezoelectric vibrations generated from the capacitor body 110 from being introduced into the circuit board. In order to secure such an effect, thicknesses of the first and second connection terminals 141 and 151 may be 50 µm or more, e.g. measured in the Z direction.

The thicknesses of the first and second connection terminals 141 and 151 need to be a predetermined thickness or more in order to sufficiently secure spaces in which solders may be stored, and when the spaces are secured as described above (e.g., first and second space portions 161 and 162), formation of solder fillets on the first and second connected portions 131a and 132a of the first and second external electrodes 131 and 132 may be suppressed. When the thicknesses of the first and second connection terminals 141 and 151 are less than 100 µm, the solder fillets may be formed on the first and second connected portions 131a and 132a of the first and second external electrodes 131 and 132, and may serve as paths through which the piezoelectric vibrations are introduced into the circuit board to decrease a noise reducing effect.

In addition, the first and second connection terminals 141 and 151 may include, respectively, conductive resin layers 141a and 151a formed on surfaces thereof by applying a conductive paste such as conductive epoxy, as illustrated in FIG. 2, if necessary. The conductive epoxy may be, for example, copper (Cu) epoxy, silver (Ag) epoxy, or the like.

Meanwhile, the conductive resin layers are formed on all the surfaces of the first and second connection terminals 141 and 151 in the drawings, but the conductive resin layers may also be formed on only mounting surfaces of the first and second connection terminals 141 and 151 or only portions of the mounting surfaces, if necessary.

The conductive resin layers 141a and 151a may absorb the piezoelectric vibrations to further reduce acoustic noise of the multilayer electronic component, and may absorb and reduce external force transferred from the circuit board to the capacitor body 110 to improve reliability of the multilayer electronic component 100.

In addition, the first and second connection terminals 141 and 151 may include plating layers, if necessary. The plating layers may include nickel (Ni) plating layers formed on the first and second connection terminals 141 and 151 and tin (Sn) plating layers formed on the nickel plating layers.

Here, $BW/4 \leq G \leq 3BW/4$ in which BW is a width (e.g., measured in the X direction) of the first or second band portion 131b or 132b of the first or second external electrode 131 or 132, W is a width (e.g., measured in the Y direction) of the first or second connected portion 131a or 132a of the first or second external electrode 131 or 132, and G is a length of the first or second solder accommodating portion 161 or 162 in the X direction.

That is, when a size G of the solder accommodating portions is ¼ or more of BW, which is the width of the band portions of the external electrodes, spaces in which the solders may be stored may be sufficiently secured to suppress the solder fillets from being formed on the first and second connected portions 131a and 132a of the first and second external electrodes 131 and 132.

In addition, when G is ¾ or more of BW, portions of the connection terminals 141 and 151 supporting the external electrodes may become excessively small, such that the capacitor body may collapse or the connection terminals may be unexpectedly separated from the external electrodes due to weak adhesion strength.

In addition, according to the present exemplary embodiment, $W/2 \leq BG \leq W$, where BG is a length of the first or second connection terminal 141 or 151 in the Y direction.

In a multilayer electronic component having a small size, since a width W of the multilayer electronic component is small, BG may be made to be smaller than W to prevent collapse of the multilayer electronic component at the time of mounting the multilayer electronic component on a circuit board. In addition, BG may be made to be equal to or greater than W/2 to sufficiently secure space in which the solders may be stored to thus serve to limit heights of the solder fillets, resulting in further reduction of the acoustic noise.

Figure 6:
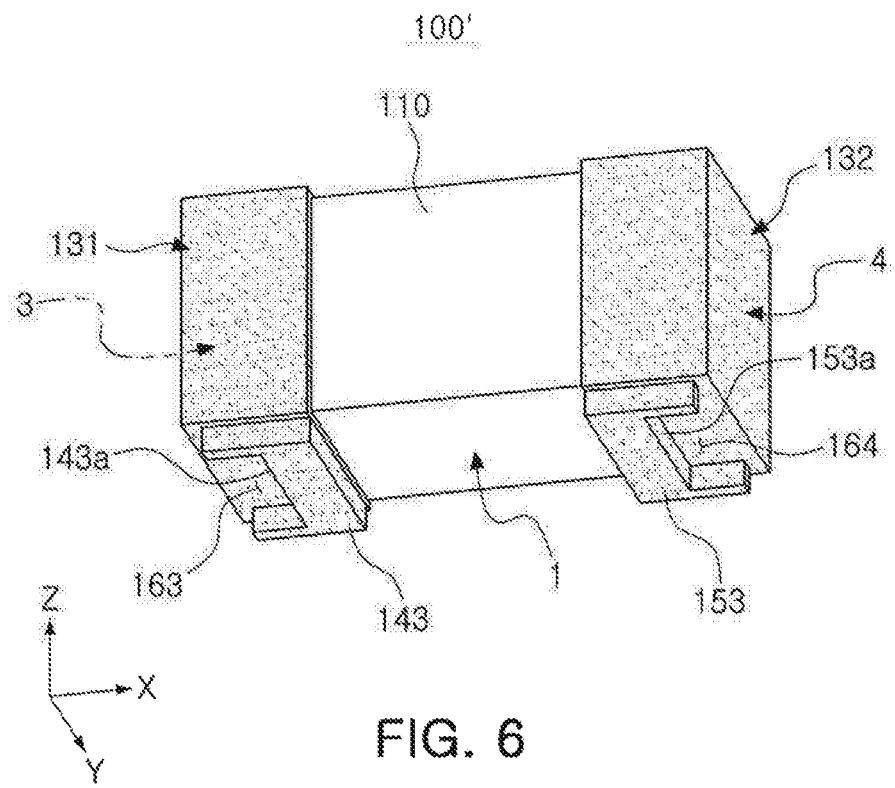
FIG. 6 is a perspective view illustrating a multilayer electronic component according to a second exemplary embodiment.
Figure 7:
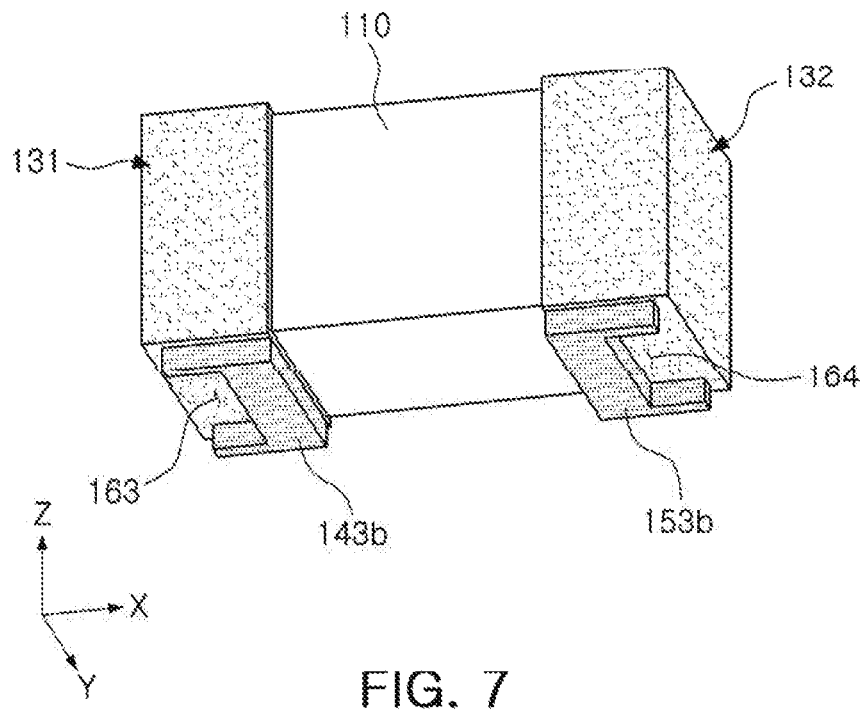
FIG. 7 is a perspective view illustrating plating layers formed on first and second connection terminals of the multilayer electronic component shown in FIG. 6.
Figure 8:
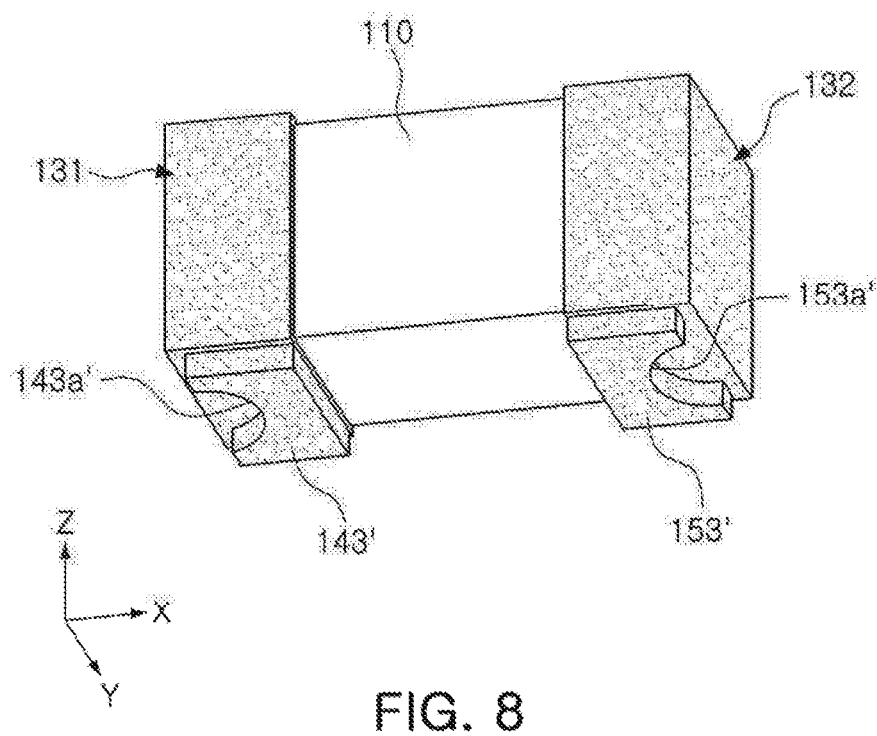
FIG. 8 is a perspective view illustrating that first and second connection terminals can have another form in the multilayer electronic component according to a second exemplary embodiment.

FIG. 6 is a perspective view illustrating a multilayer electronic component according to a second exemplary embodiment, FIG. 7 is a perspective view illustrating plating layers formed on first and second connection terminals in FIG. 6, and FIG. 8 is a perspective view illustrating that first and second connection terminals have another form in the multilayer electronic component according to a second exemplary embodiment.

Structures of a capacitor body 110, first and second internal electrodes 121 and 122, and first and second external electrodes 131 and 132 in a multilayer electronic component 100' according to the second exemplary embodiment are similar to those of the first exemplary embodiment described above, and a detailed description therefor will thus be omitted in order to avoid an overlapping description. First and second connection terminals 143 and 153 and first and second solder accommodating portions 163 and 164 having structures different from those of the first exemplary embodiment described above will be illustrated and described in detail.

Referring to FIGS. 6, 7, and 8, the first connection terminal 143 may have a first cut portion 143a formed in a first circumferential surface thereof. Therefore, the first solder accommodating portion 163 may be provided as a solder pocket on a first band portion 131b on the first surface 1 of the capacitor body 110, which is the mounting surface of the capacitor body 110.

In the present exemplary embodiment, the first cut portion 143a may be open toward the third surface 3 of the capacitor body 110. That is, the first cut portion 143a may have a quadrangular shape of which a portion toward the third surface 3 is opened, that is, a substantially '⊏' shape.

However, the first cut portion 143a is not limited thereto, but may include a plurality of bent surfaces, in addition to or instead of the '⊏' shape. For example, the first cut portion 143a may include two surfaces having one bent portion or include four or more surfaces having three or more bent portions.

The second connection terminal 153 may have a second cut portion 153a formed in a second circumferential surface thereof. Therefore, the second solder accommodating portion 164 may be provided as a solder pocket on a second band portion 132b on the first surface 1 of the capacitor body 110, which is the mounting surface of the capacitor body 110.

In the present exemplary embodiment, the second cut portion 153a may be open toward the fourth surface 4 of the capacitor body 110. That is, the second cut portion 153a may have a quadrangular shape of which a portion toward the fourth surface 4 is opened, that is, a substantially '⊏' shape.

However, the second cut portion 153a is not limited thereto, but may include a plurality of bent surfaces, in addition to or instead of the '⊏' shape. For example, the second cut portion 153a may include two surfaces having one bent portion or include four or more surfaces having three or more bent portions.

In addition, the first and second connection terminals 143 and 153 may include, respectively, conductive resin layers 143b and 153b formed on surfaces thereof, as illustrated in FIG. 7, if desired.

In addition, the first and second connection terminals 143 and 153 may include plating layers, if desired. The plating layers may include nickel (Ni) plating layers formed on the first and second connection terminals 143 and 153 and tin (Sn) plating layers formed on the nickel plating layers.

Meanwhile, as illustrated in FIG. 8, first and second connection terminals 143' and 153' may be formed so that first and second cut portions 143a' and 153a' have curved surfaces.

Here, the first and second cut portions 143a' and 153a' may be open toward the third and fourth surfaces of the capacitor body 110 along the X direction, respectively.

Therefore, first and second solder accommodating portions having a quadrangular shape may be provided on the first and second band portions of the first and second external electrodes 131 and 132, respectively, on the first surface of the capacitor body 110.

However, in the multilayer electronic component, the cut portion having the quadrangular shape may secure a relatively greater volume of solder pockets as compared to the cut portion of FIG. 8. Therefore, in the first exemplary embodiment, a relatively great volume of solders may be trapped when the multilayer electronic component is mounted on the circuit board, such that formation of the solder fillets may be effectively suppressed to further improve an acoustic noise reducing effect of the multilayer electronic component 100.

Figure 9:
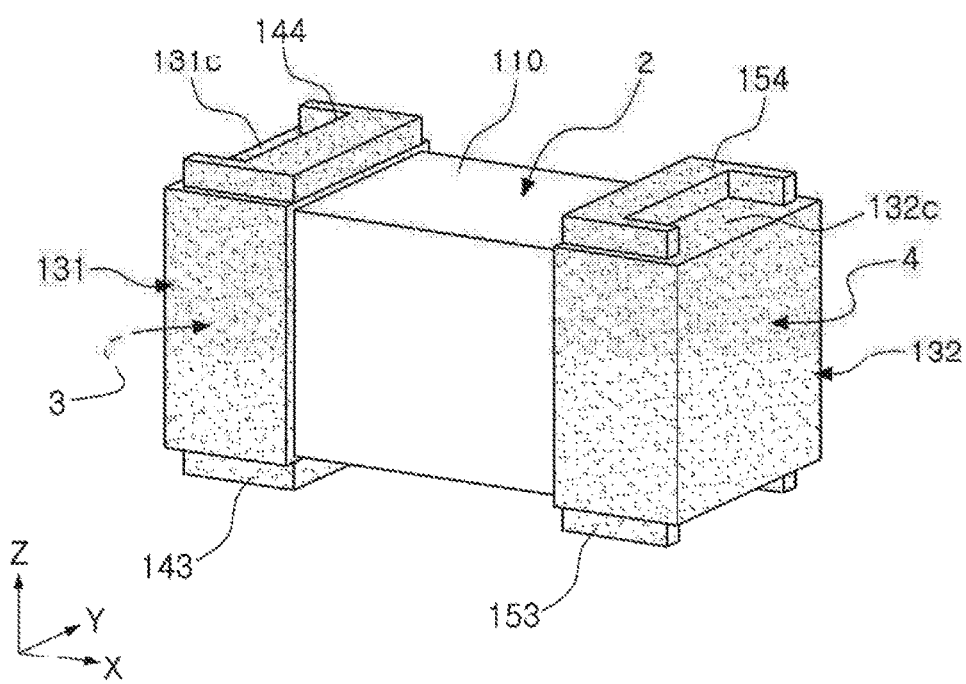
FIG. 9 is a perspective view illustrating that third and fourth connection terminals can be added to the multilayer electronic component shown in FIG. 6.

FIG. 9 is a perspective view illustrating multilayer electronic component similar to that shown in FIG. 6 and to which third and fourth connection terminals are added.

Referring to FIG. 9, a multilayer electronic component according to the present exemplary embodiment may further include third and fourth connection terminals 144 and 154.

To this end, the first and second external electrodes 131 and 132 may further include third and fourth band portions 131c and 132c extended from the first and second connected portions 131a and 132a to portions of the second surface 2 of the capacitor body 110, respectively. The third connection terminal 144 may be disposed on the third band portion 131c to be disposed opposite to the first connection terminal 143 in the Z direction, and the fourth connection terminal 154 may be disposed on the fourth band portion 132c to be disposed opposite to the second connection terminal 153 in the Z direction.

Figure 10:
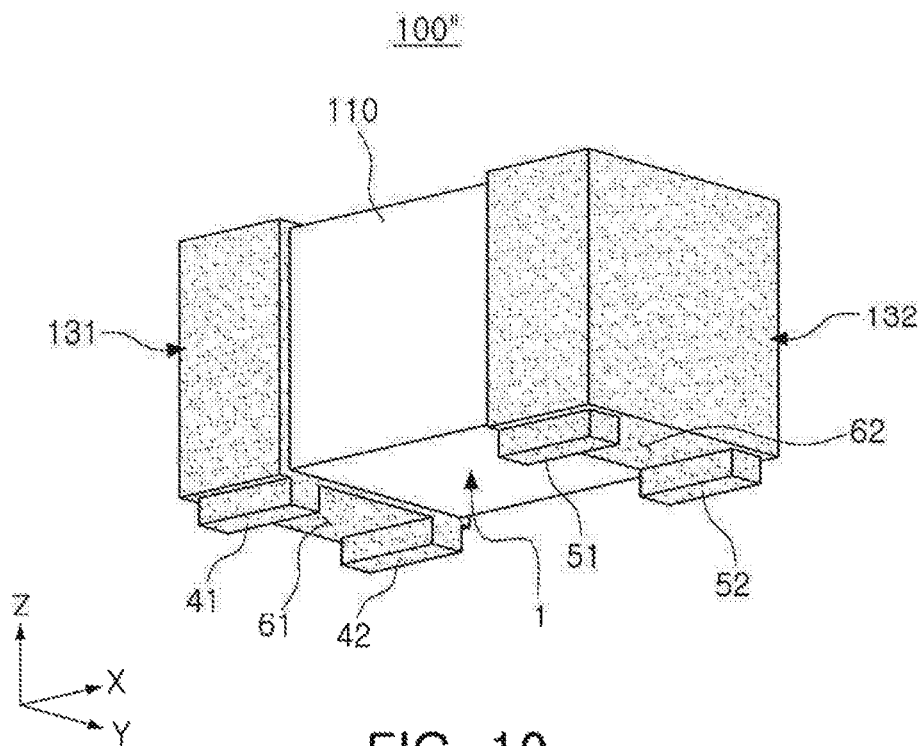
FIG. 10 is a perspective view illustrating a multilayer electronic component according to a third exemplary embodiment.
Figure 11:
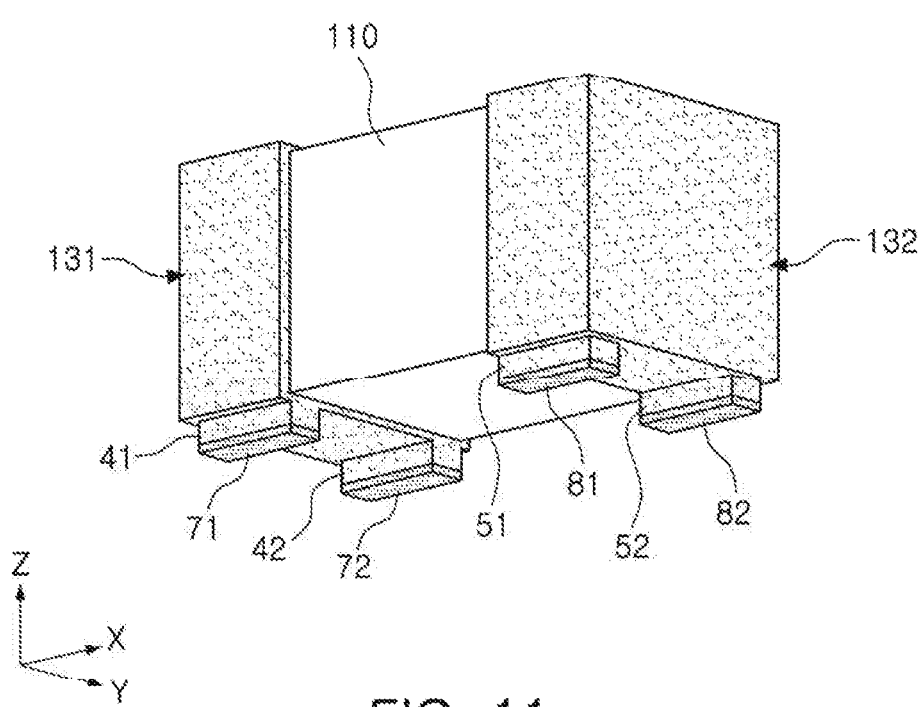
FIGS. 11 and 12 are perspective views illustrating plating layers formed on first and second connection terminals of the multilayer electronic component shown in FIG. 10.
Figure 12:
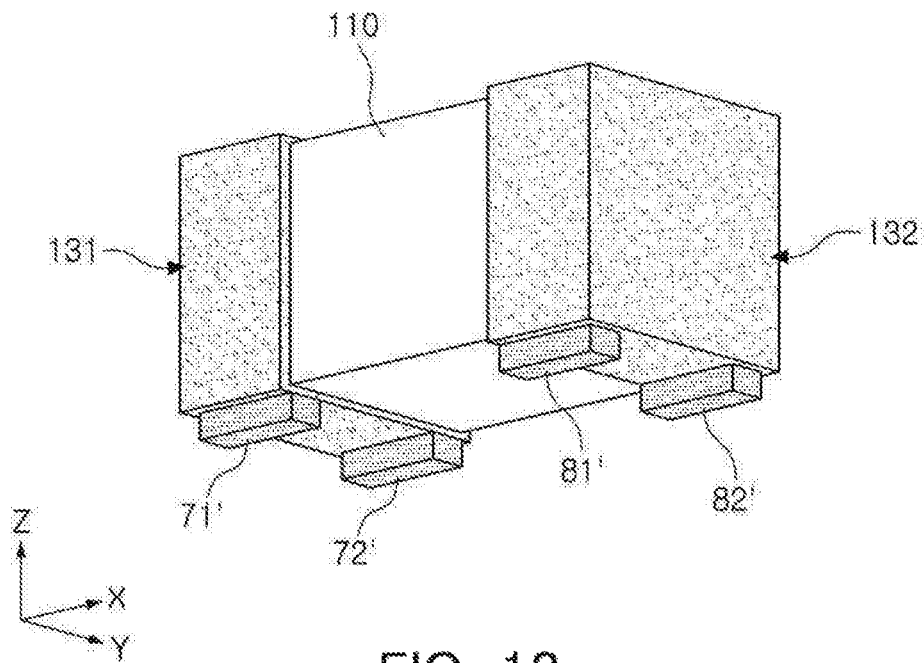

FIG. 10 is a perspective view illustrating a multilayer electronic component according to a third exemplary embodiment, and FIGS. 11 and 12 are perspective views illustrating plating layers formed on first and second connection terminals in FIG. 10.

Structures of a capacitor body 110, first and second internal electrodes 121 and 122, and first and second external electrodes 131 and 132 in a multilayer electronic component 100" according to the third exemplary embodiment are similar to those of the first exemplary embodiment described above, and a detailed description therefor will thus be omitted in order to avoid an overlapping description. First connection terminals 41 and 42, second connection terminals 51 and 52, and first and second solder accommodating portions 61 and 62 having structures different from those of the first and second exemplary embodiments described above will be illustrated and described in detail.

Referring to FIGS. 10, 11, and 12, two first connection terminals 41 and 42 may be disposed on a first band portion to face each other and be spaced apart from each other in the Y direction (e.g., the direction in which the fifth surface and the sixth surface of the capacitor body 110 are connected to each other). Therefore, a first solder accommodating portion 61 may be provided as a solder pocket on the first band portion on the first surface 1 of the capacitor body 110, which is the mounting surface of the capacitor body 110.

Two second connection terminals 51 and 52 may be disposed on a second band portion to face each other and be spaced apart from each other in the Y direction (e.g., the direction in which the fifth surface and the sixth surface of the capacitor body 110 are connected to each other).

In addition, the first connection terminals 41 and 42 and the second connection terminals 51 and 52 may include conductive resin layers formed thereon by applying a conductive paste such as conductive epoxy, if necessary.

Here, conductive resin layers 71, 72, 81, and 82 may be formed on only lower surfaces of the first connection terminals 41 and 42 and the second connection terminals 51 and 52, respectively, as illustrated in FIG. 11. The lower surfaces are surfaces configured to be in contact with the circuit board when the multilayer electronic component is mounted on a circuit board. Alternatively, conductive resin layers 71', 72', 81', and 82' may be formed to cover all the surfaces of the first connection terminals 41 and 42 and the second connection terminals 51 and 52, respectively, as illustrated in FIG. 12.

Figure 13:
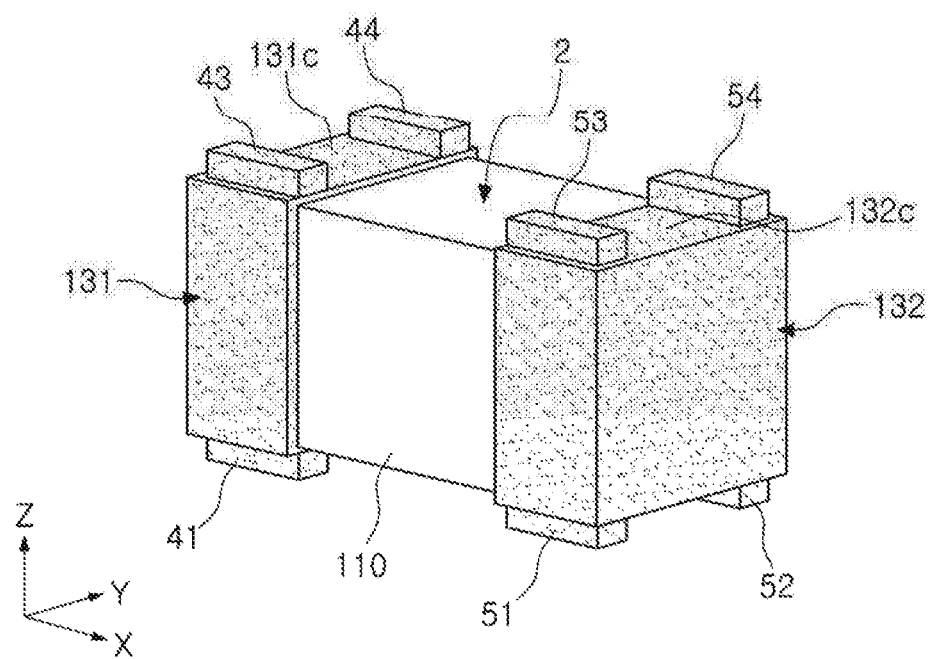
FIG. 13 is a perspective view illustrating that third and fourth connection terminals can be added to the multilayer electronic component shown in FIG. 10.

FIG. 13 is a perspective view illustrating that third and fourth connection terminals can be added to the multilayer electronic component shown in FIG. 10.

Referring to FIG. 13, a multilayer electronic component according to the present exemplary embodiment may further include third connection terminals 43 and 44 and fourth connection terminals 53 and 54. Therefore, vertical directivity of the multilayer electronic component may be removed.

To this end, the first and second external electrodes 131 and 132 may further include third and fourth band portions 131c and 132c extended from the first and second connected portions to portions of the second surface 2 of the capacitor body 110, respectively. The third connection terminals 43 and 44 may be disposed on the third band portion 131c to be disposed opposite to the first connection terminals 41 and 42, and the fourth connection terminals 53 and 54 may be disposed on the fourth band portion 132c to be disposed opposite to the second connection terminals 51 and 52.

Two third connection terminals 43 and 44 may be disposed on the third band portion 131c to face each other and be spaced apart from each other in the Y direction (e.g., the direction in which the fifth surface and the sixth surface of the capacitor body 110 are connected to each other. Two fourth connection terminals 53 and 54 may be disposed on the fourth band portion 132c to face each other and be spaced apart from each other in the Y direction (e.g., the direction in which the fifth surface and the sixth surface of the capacitor body 110 are connected to each other).

Meanwhile, the lower surfaces of the first connection terminals and the second connection terminals of FIG. 10 may be flat. Therefore, the first connection terminals and the second connection terminals may have a substantially hexahedral shape.

Figure 14:
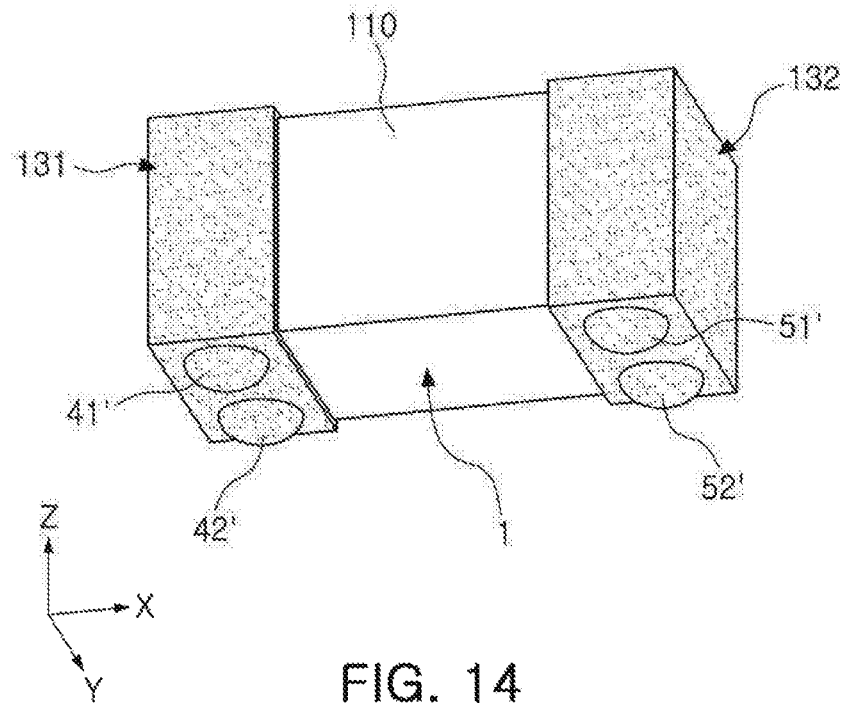
FIG. 14 is a perspective view illustrating that first and second connection terminals can have another form in the multilayer electronic component according to a third exemplary embodiment.

However, the first connection terminals and the second connection terminals are not limited thereto. For example, as illustrated in FIG. 14, lower surfaces of first connection terminals 41' and 42' and second connection terminals 51' and 52' may be convex in the first surface 1 of the capacitor body, which is the mounting surface of the capacitor body. That is, the first connection terminals 41' and 42' and the second connection terminals 51' and 52' may have a hemispherical shape having a curved surface.

Figure 15:
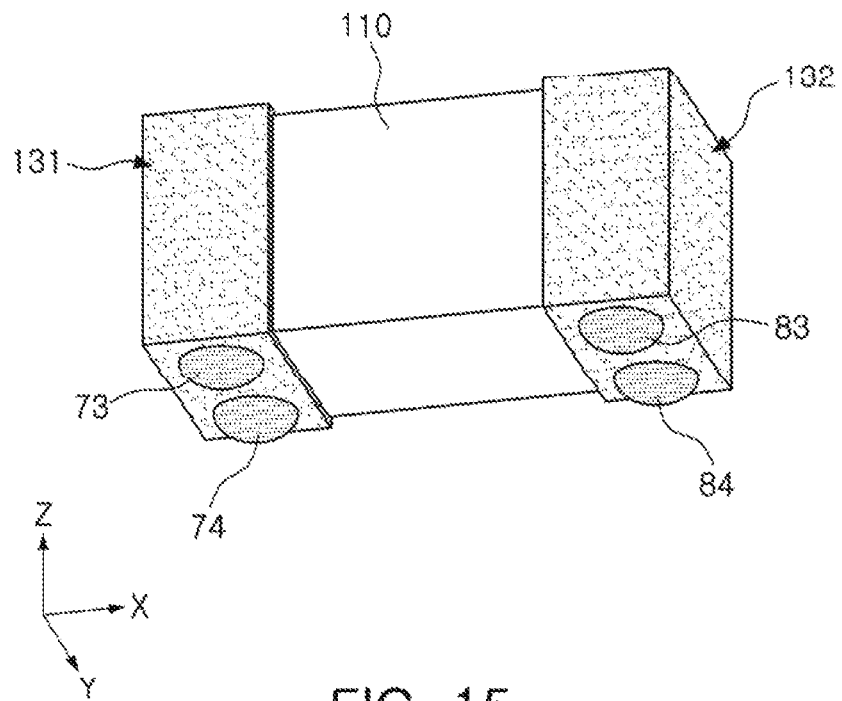
FIG. 15 is a perspective view illustrating plating layers formed on first and second connection terminals of the multilayer electronic component shown in FIG. 14.

Here, as illustrated in FIG. 15, the first connection terminals 41' and 42' and the second connection terminals 51' and 52' may include plating layers 73 and 74 and 83 and 84, respectively, if desired. The plating layers 73 and 74 and 83 and 84 may include nickel (Ni) plating layers formed on the first connection terminals 41' and 42' and the second connection terminals 51' and 52' and tin (Sn) plating layers formed on the nickel plating layers, respectively.

Figure 16:
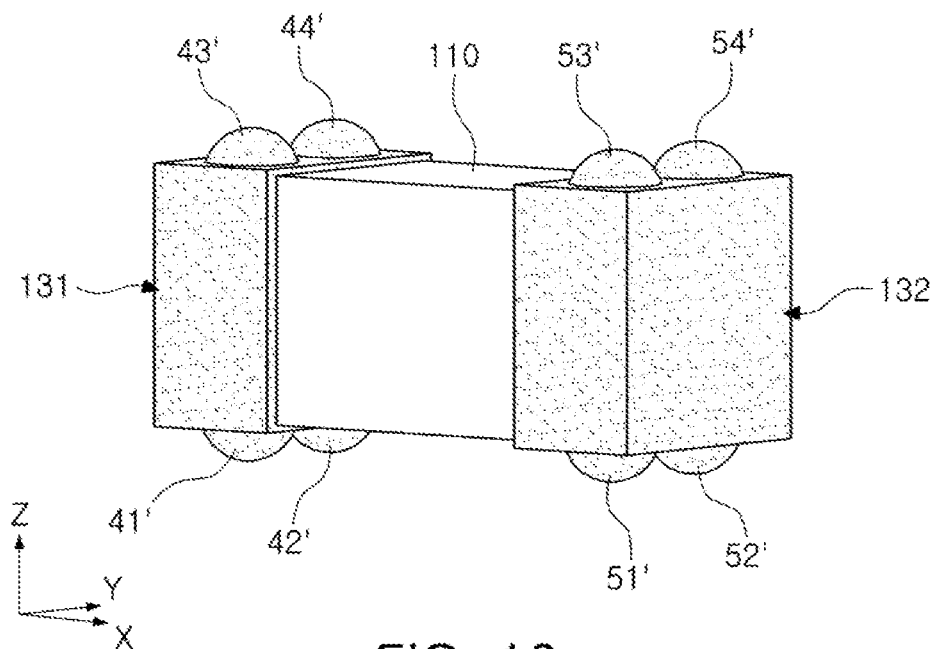
FIG. 16 is a perspective view illustrating that third and fourth connection terminals can be added to the multilayer electronic component shown in FIG. 14.

FIG. 16 is a perspective view illustrating that third and fourth connection terminals can be added to the multilayer electronic component shown in FIG. 14.

Referring to FIG. 16, a multilayer electronic component according to the present exemplary embodiment may further include third connection terminals 43' and 44' disposed opposite to the first connection terminals 41' and 42' and fourth connection terminals 53' and 54' disposed opposite to the second connection terminals 51' and 52' in the Z direction. Therefore, vertical directivity of the multilayer electronic component may be removed.

Figure 17:
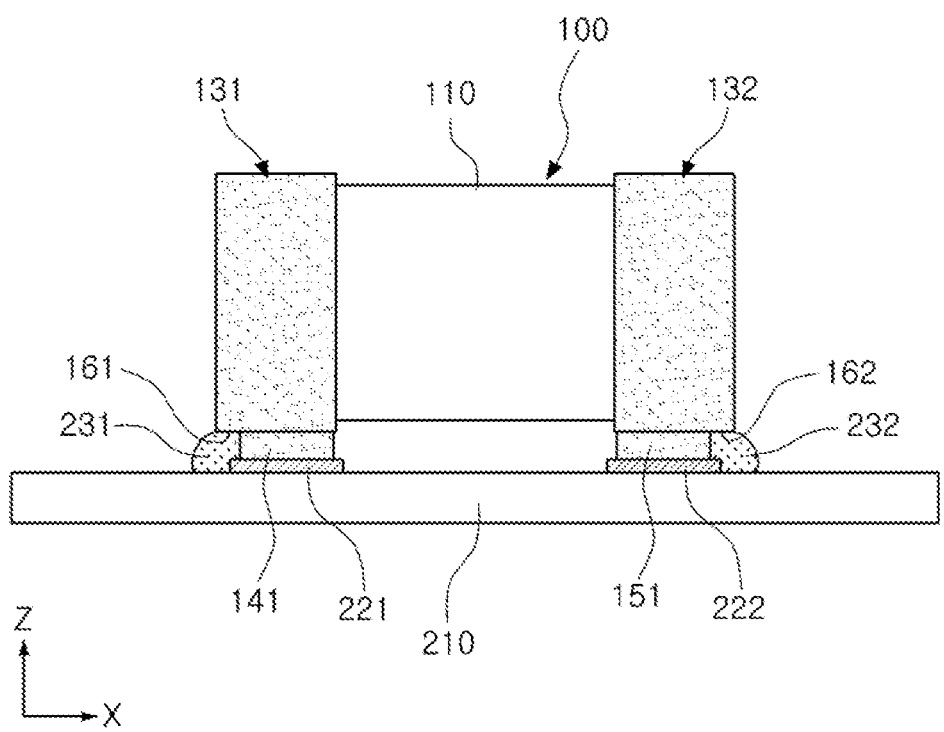
FIG. 17 is a schematic side view illustrating a multilayer electronic component according to a first exemplary embodiment that is mounted on a circuit board.

FIG. 17 is a schematic front view illustrating a multilayer electronic component according to the first exemplary embodiment that is mounted on a circuit board.

When voltages having different polarities are applied to the first and second external electrodes 131 and 132 formed on the multilayer electronic component 100 in a state in which the multilayer electronic component 100 is mounted on a circuit board 210, the capacitor body 110 may be expanded and contracted in the thickness direction due to an inverse piezoelectric effect of the dielectric layers 111, and both end portions of the first and second external electrodes 131 and 132 may be contracted and expanded as opposed to the expansion and the contraction of the capacitor body 110 in the thickness direction due to a Poisson effect.

Such a contraction and expansion may generate vibrations. In addition, the vibrations may be transferred from the first and second external electrodes 131 and 132 to the circuit board 210, and sound may thus be radiated from the circuit board 210, which becomes the acoustic noise.

Referring to FIG. 17, a board having a multilayer electronic component according to the present exemplary embodiment may include the circuit board 210 having first and second electrode pads 211 and 222 disposed on one surface thereof and the multilayer electronic component 100 mounted on an upper surface of the circuit board 210 so that the first and second connection terminals 141 and 151 thereof are connected to the first and second electrode pads 221 and 222, respectively.

Here, in the present exemplary embodiment, a case in which the multilayer electronic component 100 is mounted on the circuit board 210 by solders 231 and 232 is illustrated and described, but conductive pastes may be used instead of the solders, if desired.

According to the present exemplary embodiment, the piezoelectric vibrations transferred to the circuit board through the first and second external electrodes 131 and 132 of the multilayer electronic component 100 may be absorbed through elasticity of the first and second connection terminals 141 and 151 including insulators formed of a soft material, and acoustic noise may thus be reduced.

Additionally, the first and second solder accommodating portions 161 and 162 provided by the first and second cut portions of the first and second connection terminals 141 and 151, respectively, may serve as the solder pockets that may trap the solders 231 and 232 on the first surface of the capacitor body 110.

Therefore, the solders 231 and 232 may be more effectively trapped in the first and second solder accommodating portions 161 and 162, respectively, and formation of solder fillets extending toward the second surface of the capacitor body 110 may thus be suppressed.

Therefore, a piezoelectric vibration transfer path of the multilayer electronic component 100 may be blocked, and the solder fillets and a maximum displacement point in the capacitor body 110 may be spaced apart from each other to significantly improve an acoustic noise reducing effect of the multilayer electronic component 100.

In addition, according to the present exemplary embodiment, a vibration amount of the piezoelectric vibrations of the multilayer electronic component transferred to the circuit board at an audio frequency within 20 kHz of the multilayer electronic component may be effectively suppressed by the acoustic noise reducing structure described above.

Therefore, high frequency vibrations of the multilayer electronic component may be reduced to prevent malfunctions of sensors that may be caused by high frequency vibrations in a high frequency region of 20 kHz or more of the multilayer electronic component in information technology (IT) or industry/electrical component fields and suppress accumulation of internal fatigue of the sensors due to vibrations for a long period of time.

As set forth above, according to the exemplary embodiments, the acoustic noise and the high frequency vibrations in the high frequency region of 20 kHz or more of the multilayer electronic component may be reduced.

While exemplary embodiments have been shown and described above, it will be apparent to those skilled in the art that modifications and variations could be made without departing from the scope of the present invention as defined by the appended claims.

What is claimed is:

1. A multilayer electronic component comprising: a capacitor body including a plurality of dielectric layers and a plurality of first and second internal electrodes alternately disposed with dielectric layers interposed therebetween having first and second surfaces opposing each other, third and fourth surfaces connected to the first and second surfaces and opposing each other, and fifth and sixth surfaces connected to the first, second, third, and fourth surfaces, and opposing each other, wherein one end of each of the first and second internal electrodes is exposed through the third and fourth surfaces, respectively; first and second external electrodes including, respectively, first and second connected portions respectively disposed on the third and fourth surfaces of the capacitor body and first and second band portions respectively extended from the first and second connected portions to portions of the first surface of the capacitor body; a first connection terminal disposed on the first band portion to be spaced apart from the first connected portion so that a first space portion, open in directions corresponding to the third surface, the fifth surface, and the sixth surface of the capacitor body is provided on a lower surface of the first band portion; and a second connection terminal disposed on the second band portion to be spaced apart from the second connected portion so that a second space portion, open in directions corresponding to the fourth surface, the fifth surface, and the sixth surface of the capacitor body is provided on a lower surface of the second band portion, wherein $BW/4 \le G \le 3BW/4$ in which BW is a width of the first or second band portion of the first or second external electrode, and G is a length of the first or second space portion.

2. The multilayer electronic component of claim 1, wherein the first and second external electrodes further include third and fourth band portions extended from the first and second connected portions to portions of the second surface of the capacitor body, respectively, and third and fourth connection terminals are disposed on the third and fourth band portions, respectively, to be disposed opposite to the first and second connection terminals, respectively.

3. The multilayer electronic component of claim 1, wherein $W/2 \le BG \le W$ in which BG is a width of the first or second connection terminal measured in a first direction parallel to the third and fourth surfaces of the capacitor body, and W is a width of the capacitor body measured in the first direction.

4. A board having a multilayer electronic component, comprising: a circuit board having first and second electrode pads disposed on one surface thereof; and the multilayer electronic component of claim 2 mounted on the circuit board so that the first and second connection terminals are respectively connected to the first and second electrode pads.

5. A multilayer electronic component comprising: a capacitor body including pluralities of first and second internal electrodes alternately stacked with dielectric layers disposed therebetween; first and second external electrodes disposed on respective opposing end surfaces of the capacitor body and respectively connected to the pluralities of first and second internal electrodes, wherein the first and second external electrodes respectively include first and second connected portions disposed on a connecting surface of the capacitor body connecting the opposing end surfaces of the capacitor body; a first connection terminal disposed on the first connected portion on the connecting surface of the capacitor body, the first connection terminal comprising first and second connection terminal portions disposed separately from each other on the first connected portion to form a first space for accommodating solder; and a second connection terminal disposed on the second connected portion on the connecting surface of the capacitor body, the second connection terminal comprising third and fourth connection terminal portions disposed separately from each other on the second connected portion to form a second space for accommodating solder, wherein the first, second, third, and fourth connection terminal portions each have a hemispherical shape.

6. The multilayer electronic component of claim 5, wherein the first and second external electrodes are disposed on respective end surfaces of the capacitor body opposing each other in a length direction, the first and second connection terminal portions are spaced apart from each other on the first connected portion in a direction orthogonal to the length direction, and the third and fourth connection terminal portions are spaced apart from each other on the second connected portion in the direction orthogonal to the length direction.

7. The multilayer electronic component of claim 5, wherein the first, second, third, and fourth connection terminal portions each have a cuboid shape.

8. The multilayer electronic component of claim 7, wherein the first connection terminal further comprises a cuboid connection terminal portion disposed between the first and second connection terminal portions on the first connected portion and extending from the first connection terminal portion to the second connection terminal portion; and the second connection terminal further comprises a cuboid connection terminal portion disposed between the third and fourth connection terminal portions on the second connected portion and extending from the third connection terminal portion to the fourth connection terminal portion.

9. The multilayer electronic component of claim 8, wherein the cuboid connection terminal portions of the first and second connection terminals are spaced away from the opposing end surfaces of the capacitor body.

* * * * *